(12) United States Patent
Finch et al.

(10) Patent No.: US 9,021,321 B2
(45) Date of Patent: Apr. 28, 2015

(54) TESTING DISK DRIVES SHARED BY MULTIPLE PROCESSORS IN A SUPERCOMPUTER COMPLEX

(71) Applicant: International Business Machines Corporation, Armonk, NY (US)

(72) Inventors: Richard B. Finch, New Paltz, NY (US); Jason T. Hirst, Poughkeepsie, NY (US); Gerald G. Stanquist, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 13/709,452

(22) Filed: Dec. 10, 2012

(65) Prior Publication Data
US 2014/0164857 A1 Jun. 12, 2014

(51) Int. Cl.
*G11C 29/00* (2006.01)
*G11C 29/04* (2006.01)
*G11B 5/012* (2006.01)
*G11B 20/18* (2006.01)

(52) U.S. Cl.
CPC ............... *G11C 29/04* (2013.01); *G11B 5/012* (2013.01); *G11B 20/1816* (2013.01)

(58) Field of Classification Search
CPC ................................ G11C 29/56; G11C 29/48
USPC .......... 714/718, 724, 742, 763, 54, 48, 42, 40
See application file for complete search history.

(56) References Cited

U.S. PATENT DOCUMENTS

| 5,423,044 | A | 6/1995 | Sutton et al. |
| 5,787,094 | A | 7/1998 | Cecchi et al. |
| 6,321,352 | B1 * | 11/2001 | Wasson .......................... 714/724 |
| 6,339,793 | B1 | 1/2002 | Bostian et al. |
| 6,836,750 | B2 | 12/2004 | Wong et al. |
| 6,976,190 | B1 * | 12/2005 | Goldstone ....................... 714/42 |
| 7,058,858 | B2 | 6/2006 | Wong et al. |
| 7,243,043 | B2 * | 7/2007 | Shin .............................. 702/182 |
| 7,805,514 | B2 | 9/2010 | Yang |
| 7,848,106 | B2 * | 12/2010 | Merrow ......................... 361/696 |
| 7,912,666 | B1 * | 3/2011 | Pakzad et al. ................. 702/115 |
| 8,078,421 | B1 * | 12/2011 | Shastry et al. ................ 702/115 |

OTHER PUBLICATIONS

Gheith, A.M.-et al.; "Shared Virtual Disk for a Cluster of Processors with Separate I/O Devices and Shared Memory," IBM TDB, vol. 36, No. 6B, Jun. 1993, pp. 375-378.
Gheith, A.M.-et al.; "Shared Memory RAM Disk for a Cluster with Shared Memory," IBM Technical Disclosure Bulletin, vol. 36, No. 06B, Jun. 1993, pp. 299-300.

* cited by examiner

*Primary Examiner* — Fritz Alphonse
(74) *Attorney, Agent, or Firm* — VanLeeuwen & VanLeeuwen; Steven L. Bennett

(57) ABSTRACT

An interface node selects a logical block address that corresponds to a contiguous memory location located on a storage device that is accessible by multiple interface nodes. The interface node retrieves a logical block address status indicator from a shared memory area and determines, based upon the logical block status indicator, whether the logical block address is utilized by a different interface node. If the logical block address is not utilized by a different interface node, the interface node tests the corresponding contiguous memory location.

25 Claims, 8 Drawing Sheets

| Shared Memory 120 | | | |
|---|---|---|---|
| Interface Node ID | LBA Start | LBA End | Lock Time |
| 2 | addr A | addr A | 14:52 |
|  | addr C | addr C |  |
| 1 | addr E | addr E | 12:48 |
|  | addr G | addr G |  |
| ... | ... | ... | ... |

Exerciser Message Structure 500

```
struct
{
        node ID
        function to call
        number of parameters to follow
        parameter 1
        ...
        parameter n
} message;
```

FIG. 5A

Shared Memory Construct 540

```
define LOCK_TIMEOUT 1234 table_entry *table_ptr = 0 for example struct
{
        int ID
        int start_LBA
        int end_LBA
        int lock_time (time that lock was acquired)

struct table_entry *next
        struct table_entry *prev
} table_entry
```

FIG. 5B

TESTING DISK DRIVES SHARED BY MULTIPLE PROCESSORS IN A SUPERCOMPUTER COMPLEX

BACKGROUND

The present disclosure relates to testing disk drives shared by multiple processors in a supercomputer complex. More particularly, the present disclosure relates to using a shared memory to prevent write collisions between multiple interface nodes when testing shared disk drives.

Supercomputer complexes typically include a substantial amount of processors that are utilized for highly calculation-intensive tasks, such as quantum physics problems, weather forecasting, climate research, oil and gas exploration, molecular modeling, etc. In a supercomputer complex, multiple processors may share a direct access storage device (DASD) domain, which includes multiple storage devices configured in an array format. As such, a supercomputer complex may also include interface nodes to manage data traffic between the processors and the DASD.

BRIEF SUMMARY

According to one embodiment of the present disclosure, an approach is provided in which an interface node selects a logical block address that corresponds to a contiguous memory location located on a storage device that is accessible by multiple interface nodes. The interface node retrieves a logical block address status indicator from a shared memory area and determines, based upon the logical block status indicator, whether the logical block address is utilized by a different interface node. If the logical block address is not utilized by a different interface node, the interface node tests the corresponding contiguous memory location.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein:

FIG. 3 is an exemplary diagram of a shared memory construct that manages logical block address locks initiated by various interface nodes;

FIG. 5A is an exemplary diagram showing an exerciser message structure corresponding to messages that a low-level disk exerciser sends to a shared memory construct via an API (application programming interface);

FIG. 5B is an diagram showing an exemplary structure of a shared memory construct;

DETAILED DESCRIPTION

Figure 1:
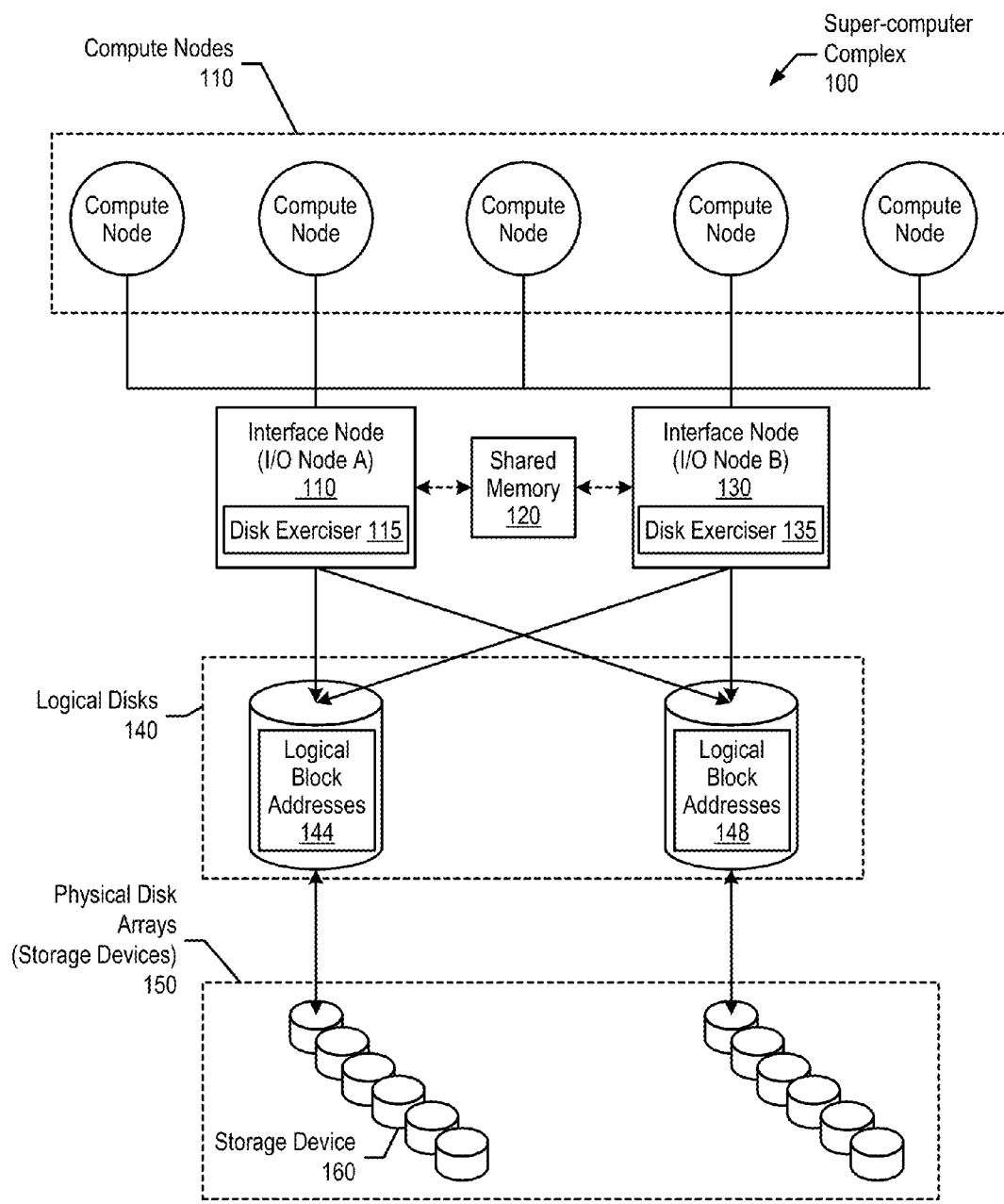
FIG. 1 is a diagram showing interface nodes using a shared memory to avoid write conflicts when testing storage areas within a supercomputer complex.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The following detailed description will generally follow the summary of the disclosure, as set forth above, further explaining and expanding the definitions of the various aspects and embodiments of the disclosure as necessary.

FIG. 1 is a diagram showing interface nodes using a shared memory to avoid write conflicts when testing storage areas within a supercomputer complex. Supercomputer complex 100 includes a substantial amount of processors (compute nodes 110) and includes multiple I/O nodes (interface nodes 110 and 130) that handle compute nodes 110's data storage and retrieval requirements. Interface nodes 110 and 130, in one embodiment, utilize logical disks 140 to read and write blocks of data to physical disk arrays 150 (storage devices configured in an array format) according to a logical block addressing mechanism (logical block addresses 144 and 148). In this embodiment, logical block addressing may include starting/ending addresses, or may be configured as a linear addressing scheme where blocks are located by an integer index, with the first block being LBA 0, the second LBA 1, and so on.

A requirement of supercomputer complex 100 is to ensure that physical disk arrays 150 are functioning properly, such as ensuring that memory locations are not stuck at a "1" or a "0", and/or ensuring that their addressing logic is functioning correctly. As such, interface nodes 110 and 130 include disk exercisers 115 and 135, respectively, to randomly select logical block addresses and write/read/compare data to one of physical disk arrays 150's contiguous memory locations corresponding to the selected logical block addresses. Disk exercisers 115 and 135 may be software modules, hardware modules, or a combination of software modules and hardware modules.

Each of disk exercisers 115 and 135 utilize a random signal number generator to randomly select a logical block address and, in turn, randomly test various contiguous memory locations within physical disk arrays 150. In order to avoid write conflicts between interface nodes 110 and 130, disk exercisers 115 and 135 utilize shared memory 120 to synchronize rule changes and/or inform each other as to their particular logical block address utilization.

In one embodiment, disk exercisers 115 and 135 employ a message passing approach (e.g., message passing application programming interface (MAPI)) to communicate with a shared memory construct (shared memory 120). In this embodiment, disk exerciser 115 may randomly select a logical block address corresponding to a contiguous memory location within storage device 160, and send a message to shared memory 120 (via API interface) to determine whether interface node 130 is currently utilizing the selected logical block address (see FIG. 6A and corresponding text for further details). Disk exerciser 115 receives a logical block status indicator back from shared memory 120 (via API interface) that indicates whether the selected logical block address is locked by a different interface node (interface node 130). If the logical block address is not locked, disk exerciser 115 sends a lock message to shared memory 120 to lock the logical block address (see FIG. 6B and corresponding text for further details), and proceeds to write/read/compare data to the contiguous memory location in storage device 160 (see FIG. 4 and corresponding text for further details). In another embodiment, interface node 110 and interface node 130 communicate with shared memory 120 using other approaches such as through a memory controller module.

Figure 2:
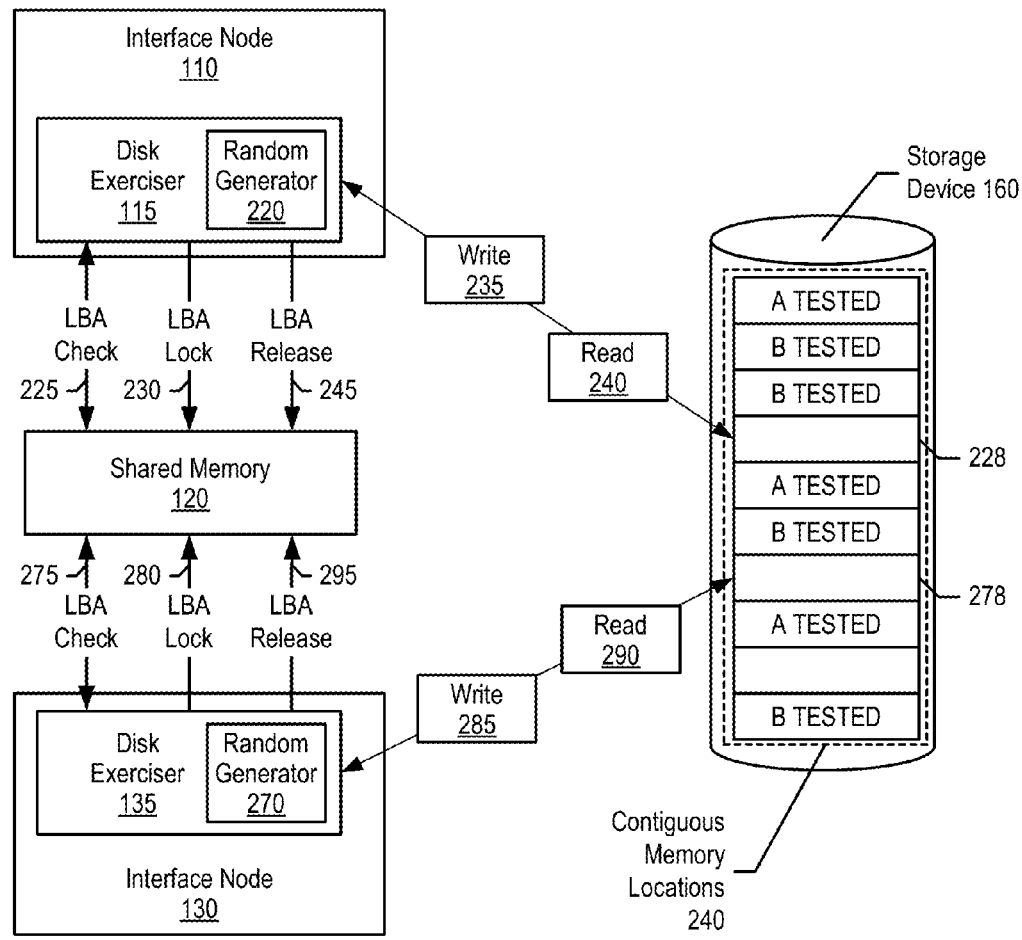
FIG. 2 is a diagram showing two interface nodes concurrently testing memory blocks that are located within a storage device.

FIG. 2 is a diagram showing two interface nodes concurrently testing memory blocks that are located within a storage device. Disk exerciser 115 generates a logical block address based upon a random number generated by random number generator 220. In turn, disk exerciser 115 sends a message to shared memory 120 via an API interface to check whether the logical block address is available (LBA check message 225, see FIG. 6A and corresponding text for further details). If the logical block address is available, disk exerciser 115 sends LBA lock message 230 to lock the logical block address so other interface nodes are not allowed access (see FIG. 6B and corresponding text for further details). In turn, disk exerciser 115 tests contiguous memory location 228 (part of contiguous memory locations 240) via write 235 and read 240 to determine whether the contiguous memory location is functioning properly (e.g., no stuck bits). When disk exerciser 115 is finished testing contiguous memory location 228, disk exerciser 115 sends LBA release message 245 to release the lock on the logical block address (see FIG. 6C and corresponding text for further details).

Concurrently, disk exerciser 135 receives a random number from random number generator 270 and generates a logical block address. In one embodiment, disk exerciser 135 generates the same logical block address that was locked by disk exerciser 115 discussed above. In this embodiment, when disk exerciser 135 checks the availability of the logical block address via address check message 275, disk exerciser 135 receives a response that indicates an addressing conflict (the logical block address is already locked). As such, disk exerciser 135 receives a different random number from random number generator 270 and generates a different logical block address. In one embodiment, disk exerciser 135 re-seeds random number generator 270 when the number of address conflicts reaches a threshold (see FIG. 4 and corresponding text for further details).

Disk exerciser 135, in turn, sends a message to shared memory 120 via an API interface to check whether the different logical block address is available (LBA check message 275). If the different logical block address is available, disk exerciser 135 sends LBA lock message 280 to lock the different logical block address from interface node 110's usage. In turn, disk exerciser 135 tests contiguous memory location 278 via write 285 and read 290 to determine whether the contiguous memory location is functioning properly (e.g., no stuck bits). When disk exerciser 135 is finished testing contiguous memory location 278, disk exerciser 135 sends address LBA release message 295 to release the lock on the different logical block address.

FIG. 3 is an exemplary diagram of a shared memory construct that manages logical block address locks initiated by various interface nodes. Shared memory 120, in one embodiment, is a memory construct that is organized in a table format to track LBA locks for various interface nodes. In this embodiment, shared memory 120 may include columns 310-340 shown in FIG. 3.

Column 310 includes the interface node identifier of the interface node that has a lock on a particular logical block address. Columns 320 and 330 include the starting address and ending address of the locked logical block address. In one embodiment, shared memory may include a LBA integer number column instead of columns 320 and 330 to identify the logical block addresses by their corresponding integer indexes. And, column 340 includes lock times that an interface node locks a particular logical block address.

FIG. 3 also shows a few table entries that do not include interface node identifiers and lock times, which are stale entries in shared memory 120. In one embodiment, shared memory 120 manages the table entries and removes entries that have exceeded a lock timeout (e.g., an LBA is locked by a disk exerciser for an extended amount of time, see FIG. 4 and corresponding text for further details).

Figure 4:
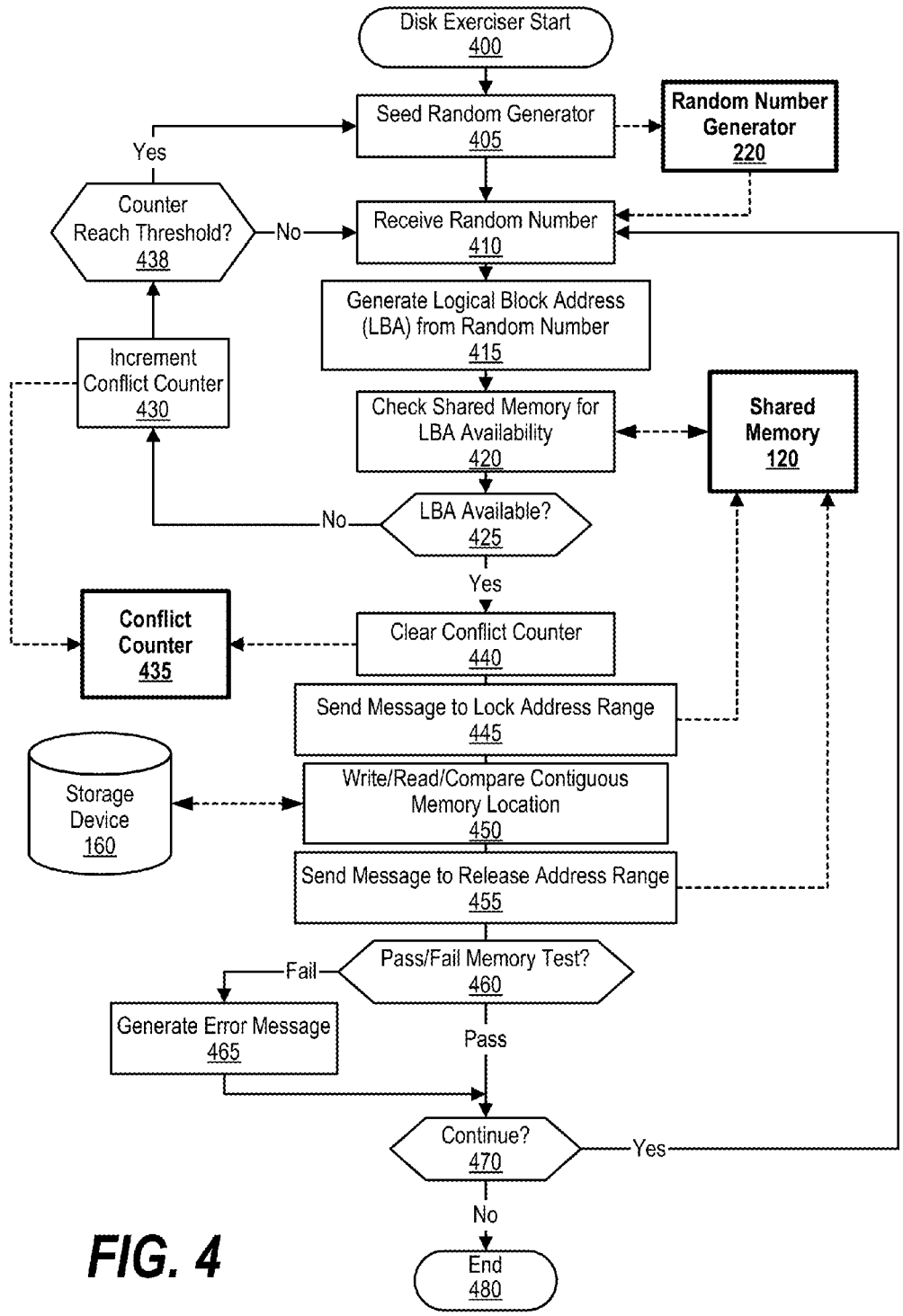
FIG. 4 is a flowchart showing steps taken in a low-level disk exerciser, which executes on an interface node, checking shared memory for an available logical block address and testing a corresponding contiguous memory location included in a storage device.

FIG. 4 is a flowchart showing steps taken in a low-level disk exerciser, which executes on an interface node (nodes 110 and 130), checking shared memory for an available logical block address and testing a corresponding contiguous memory location included in a storage device. Disk exerciser processing commences at 400, whereupon the disk exerciser seeds random number generator 220 with a seed value (step 405). At step 410, the disk exerciser receives a random number from random number generator 220 based upon the seed value.

The disk exerciser generates an address range (logical block address) according to the random number at step 415 and, at step 420, checks shared memory 120 to determine whether the generated logical block address is allocated (e.g., utilized by a different interface node). For example, a different interface node may be in the middle of testing a contiguous memory location that corresponds to the generated logical block address.

A determination is made as to whether the logical block address is available (decision 425). For example, the disk exerciser may send a message such as LBA check message 225 shown in FIG. 6A via an API interface to a shared memory construct. If the logical block address is not available, decision 425 branches to the "No" branch, whereupon the disk exerciser increments conflict counter 435 at step 430, which counts the consecutive amount of times that the disk exerciser encounters conflicts with acquiring a lock on a generated logical block address.

A determination is made as to whether conflict counter 435 reached a threshold (decision 438). If conflict counter reached a threshold, decision 438 branches to the "No" branch, whereupon the disk exerciser receives a different random number from random number generator 220 based upon the same seed value that was provided in step 405 discussed above (step 410). However, if the conflict counter reached the threshold, decision 438 ranches to the "Yes" branch, whereupon the disk exerciser re-seeds random number generator at step 405.

Referring back to decision 425, when the disk exerciser determines that the logical block address is available, decision 425 branches to the "Yes" branch, whereupon the disk exerciser clears conflict counter 435 at step 440. The disk exerciser sends a logical block address lock message (e.g., LBA lock message 230 shown in FIG. 6B) to shared memory 120 at step 445, which prohibits other interface nodes from accessing a contiguous memory location corresponding to the logical block address. In one embodiment, shared memory 120 includes a table that tracks logical block address locks according to interface nodes (see FIG. 3 and corresponding text for further details).

In turn, the disk exerciser performs a write/read/compare test on the contiguous memory location included in storage device 160 that corresponds to the logical block address (step 450). The disk exerciser sends a logical block address release message (e.g., LBA release message 245 shown in FIG. 6C) to shared memory 120 at step 455, which releases the lock on the logical block address and allows other interface nodes to capture the logical block address.

A determination is made as to whether the contiguous memory location test passed (decision 460). If the contiguous memory location passed, decision 460 branches to the "PASS" branch. However, if the contiguous memory location test failed, decision 460 branches to the "Fail" branch, whereupon the disk exerciser generates an error message at step 465, indicating the failing contiguous memory locations.

A determination is made as to whether to continue testing contiguous memory locations (decision 470). If the disk exerciser should continue to test contiguous memory locations, decision 470 branches to the "Yes" branch, which loops back to receive another random number and test a corresponding logical block address' contiguous memory locations. This looping continues until the disk exerciser should terminate, at which point decision 470 branches to the "No" branch, whereupon processing ends at 480.

FIG. 5A is an exemplary diagram showing a disk exerciser message structure corresponding to messages that a low-level disk exerciser sends to a shared memory construct via an API interface. Exerciser message structure 500 shows that, in one embodiment, disk exerciser messages include an identifier of the disk exerciser's corresponding interface node and various parameters, such as checking a particular logical block address and/or locking/releasing a logical block address (see FIGS. 6A-6C and corresponding text for further details).

FIG. 5B is a diagram showing an exemplary structure of a shared memory construct. Shared memory construct 540 shows that, in one embodiment, a shared memory construct may be organized as a table that includes columns for an interface node ID, an LBA starting address, an LBA ending address, and a lock time that the interface node locked the LBA (see FIG. 3 and corresponding text for further details). As those skilled in the art can appreciate, other structures may be utilized by the shared memory to track LBA utilization (e.g., memory arrays, etc.).

Figure 6A:
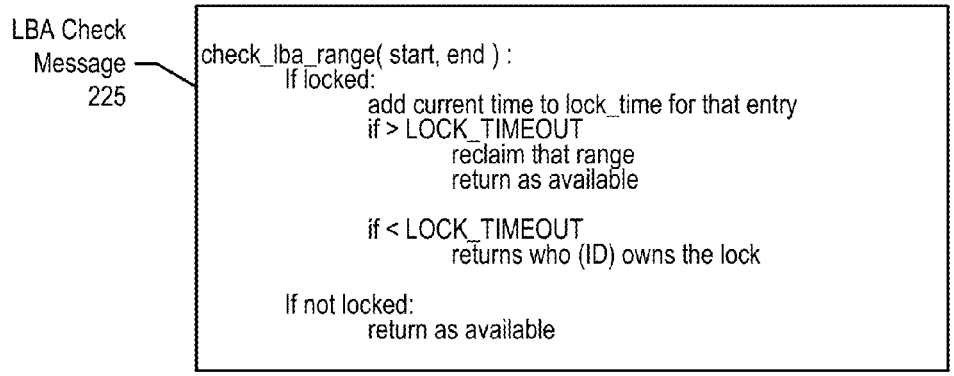
FIG. 6A depicts an exemplary message sent from a disk exerciser to a shared memory construct to check whether a logical block address is utilized by a different disk exerciser.

FIG. 6A depicts an exemplary message sent from a disk exerciser to a shared memory construct to check whether a logical block address is utilized by a different disk exerciser. LBA check message 225 shows that the disk exerciser is requesting the status of a particular LBA that includes a start address and an end address. If the requested LBA is locked, the shared memory construct returns a logical block status indicator that includes the ID corresponding to an interface node that has the lock. Otherwise, the shared memory construct returns a logical block status indicator that indicates the LBA is available. In one embodiment, as shown in FIG. 6A, if a particular LBA is locked for an amount of time that exceeds a lock timeout threshold, the shared memory construct will release the lock and, in turn, making the LBA available to other disk exercisers.

Figure 6B:
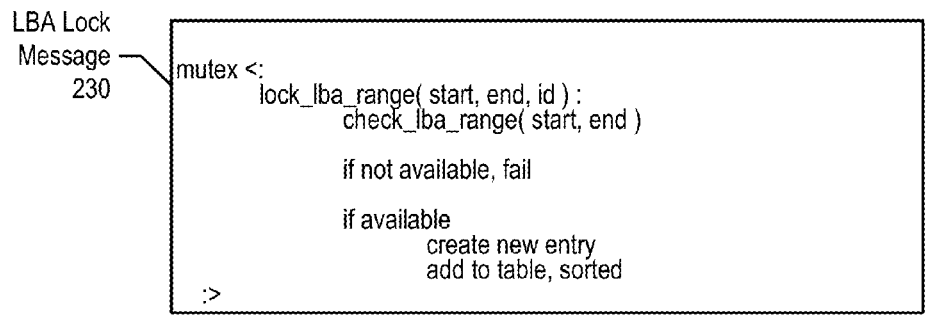
FIG. 6B depicts an exemplary message sent from a disk exerciser to a shared memory construct to lock a logical block address.

FIG. 6B depicts an exemplary message sent from a disk exerciser to a shared memory construct to lock a logical block address. LBA lock message 230 shows that the disk exerciser sends its ID (interface node ID), a start address, and an end address. In turn, the shared memory construct checks the LBA range (start address/end address), even though disk exerciser may have recently sent an LBA check message 225. If the LBA is still available, the shared memory construct creates a new table entry that indicates the LBA is locked for the requesting disk exerciser. Otherwise, if the LBA is locked, the shared memory construct returns a message back to the disk exerciser informing the disk exerciser that the lock request failed.

Figure 6C:
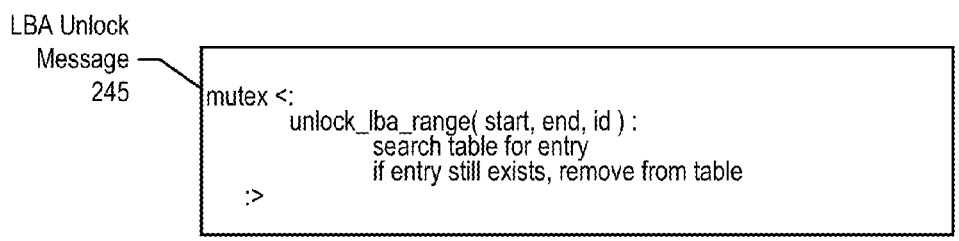
FIG. 6C depicts an exemplary message sent from a disk exerciser to a shared memory construct to unlock a logical block address.

FIG. 6C depicts an exemplary message sent from a disk exerciser to a shared memory construct to unlock an LBA. LBA unlock message 245 shows that the disk exerciser sends its ID (interface node ID), a start address, and an end address. The shared memory construct locates the table entry corresponding to the interface node/LBA combination, and unlocks the LBA accordingly. In one embodiment, the table entry may have been removed because it previously exceeded a lock timeout threshold (see FIG. 6A and corresponding text for further details).

Figure 7:
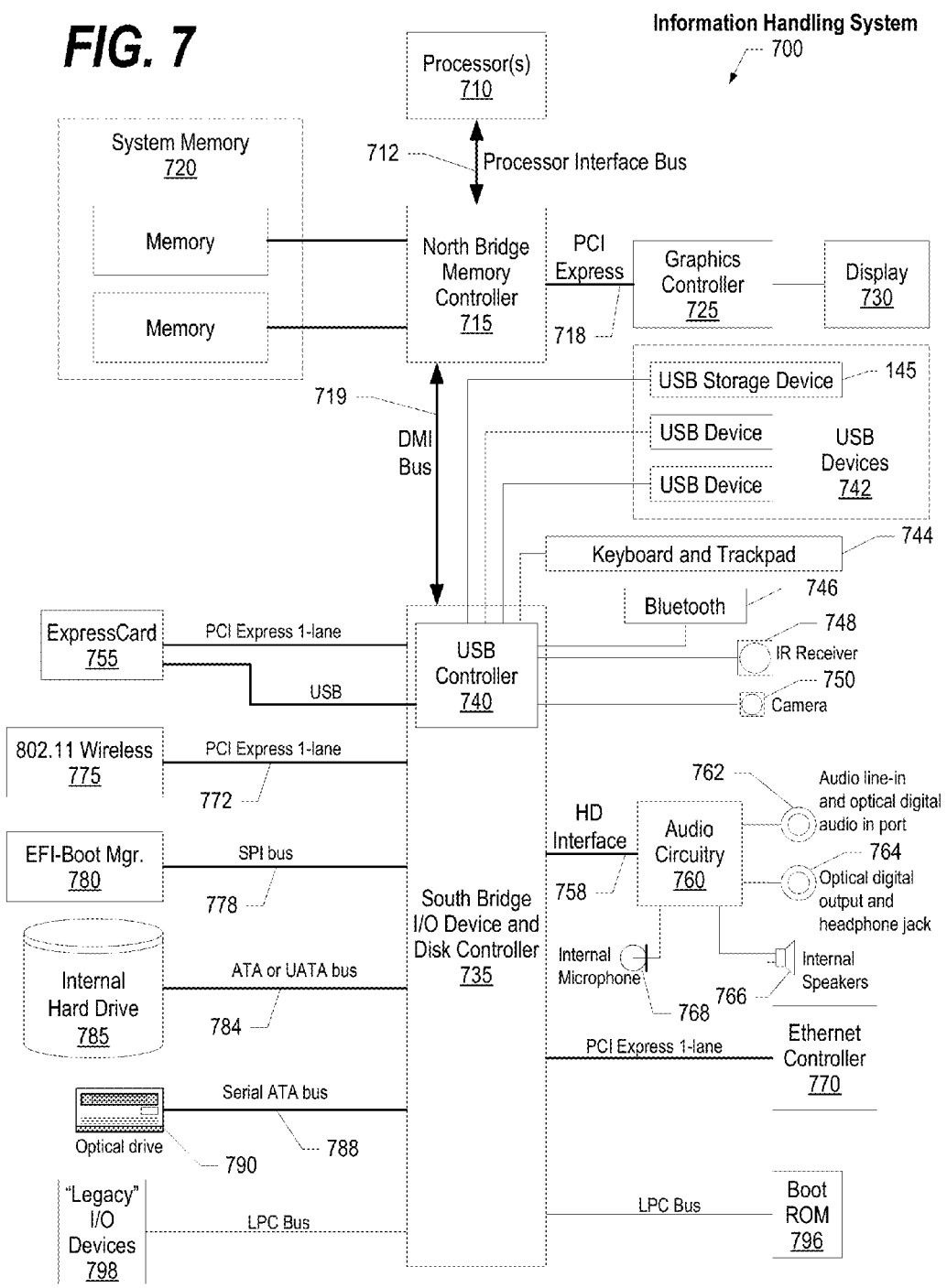
FIG. 7 is a block diagram of a data processing system in which the methods described herein can be implemented.

FIG. 7 illustrates information handling system 700, which is a simplified example of a computer system capable of performing the computing operations described herein. Information handling system 700 includes one or more processors 710 coupled to processor interface bus 712. Processor interface bus 712 connects processors 710 to Northbridge 715, which is also known as the Memory Controller Hub (MCH). Northbridge 715 connects to system memory 720 and provides a means for processor(s) 710 to access the system memory. Graphics controller 725 also connects to Northbridge 715. In one embodiment, PCI Express bus 718 connects Northbridge 715 to graphics controller 725. Graphics controller 725 connects to display device 730, such as a computer monitor.

Northbridge 715 and Southbridge 735 connect to each other using bus 719. In one embodiment, the bus is a Direct Media Interface (DMI) bus that transfers data at high speeds in each direction between Northbridge 715 and Southbridge 735. In another embodiment, a Peripheral Component Interconnect (PCI) bus connects the Northbridge and the Southbridge. Southbridge 735, also known as the I/O Controller Hub (ICH) is a chip that generally implements capabilities that operate at slower speeds than the capabilities provided by the Northbridge. Southbridge 735 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 796 and "legacy" I/O devices (using a "super I/O" chip). The "legacy" I/O devices (798) can include, for example, serial and parallel ports, keyboard, mouse, and/or a floppy disk controller. The LPC bus also connects Southbridge 735 to Trusted Platform Module (TPM) 795. Other components often included in Southbridge 735 include a Direct Memory Access (DMA) controller, a Programmable Interrupt Controller (PIC), and a storage device controller, which connects Southbridge 735 to nonvolatile storage device 785, such as a hard disk drive, using bus 784.

ExpressCard 755 is a slot that connects hot-pluggable devices to the information handling system. ExpressCard 755 supports both PCI Express and USB connectivity as it connects to Southbridge 735 using both the Universal Serial Bus (USB) the PCI Express bus. Southbridge 735 includes USB Controller 740 that provides USB connectivity to devices that connect to the USB. These devices include webcam (camera) 750, infrared (IR) receiver 748, keyboard and trackpad 744, and Bluetooth device 746, which provides for wireless personal area networks (PANs). USB Controller 740 also provides USB connectivity to other miscellaneous USB connected devices 742, such as a mouse, removable nonvolatile storage device 745, modems, network cards, ISDN connectors, fax, printers, USB hubs, and many other types of USB connected devices. While removable nonvolatile storage device 745 is shown as a USB-connected device, removable nonvolatile storage device 745 could be connected using a different interface, such as a Firewire interface, etcetera.

Wireless Local Area Network (LAN) device 775 connects to Southbridge 735 via the PCI or PCI Express bus 772. LAN device 775 typically implements one of the IEEE 802.11 standards of over-the-air modulation techniques that all use the same protocol to wireless communicate between information handling system 700 and another computer system or device. Optical storage device 790 connects to Southbridge 735 using Serial ATA (SATA) bus 788. Serial ATA adapters and devices communicate over a high-speed serial link. The Serial ATA bus also connects Southbridge 735 to other forms of storage devices, such as hard disk drives. Audio circuitry 760, such as a sound card, connects to Southbridge 735 via bus 758. Audio circuitry 760 also provides functionality such as audio line-in and optical digital audio in port 762, optical digital output and headphone jack 764, internal speakers 766, and internal microphone 768. Ethernet controller 770 connects to Southbridge 735 using a bus, such as the PCI or PCI Express bus. Ethernet controller 770 connects information handling system 700 to a computer network, such as a Local Area Network (LAN), the Internet, and other public and private computer networks.

While FIG. 7 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

Figure 8:
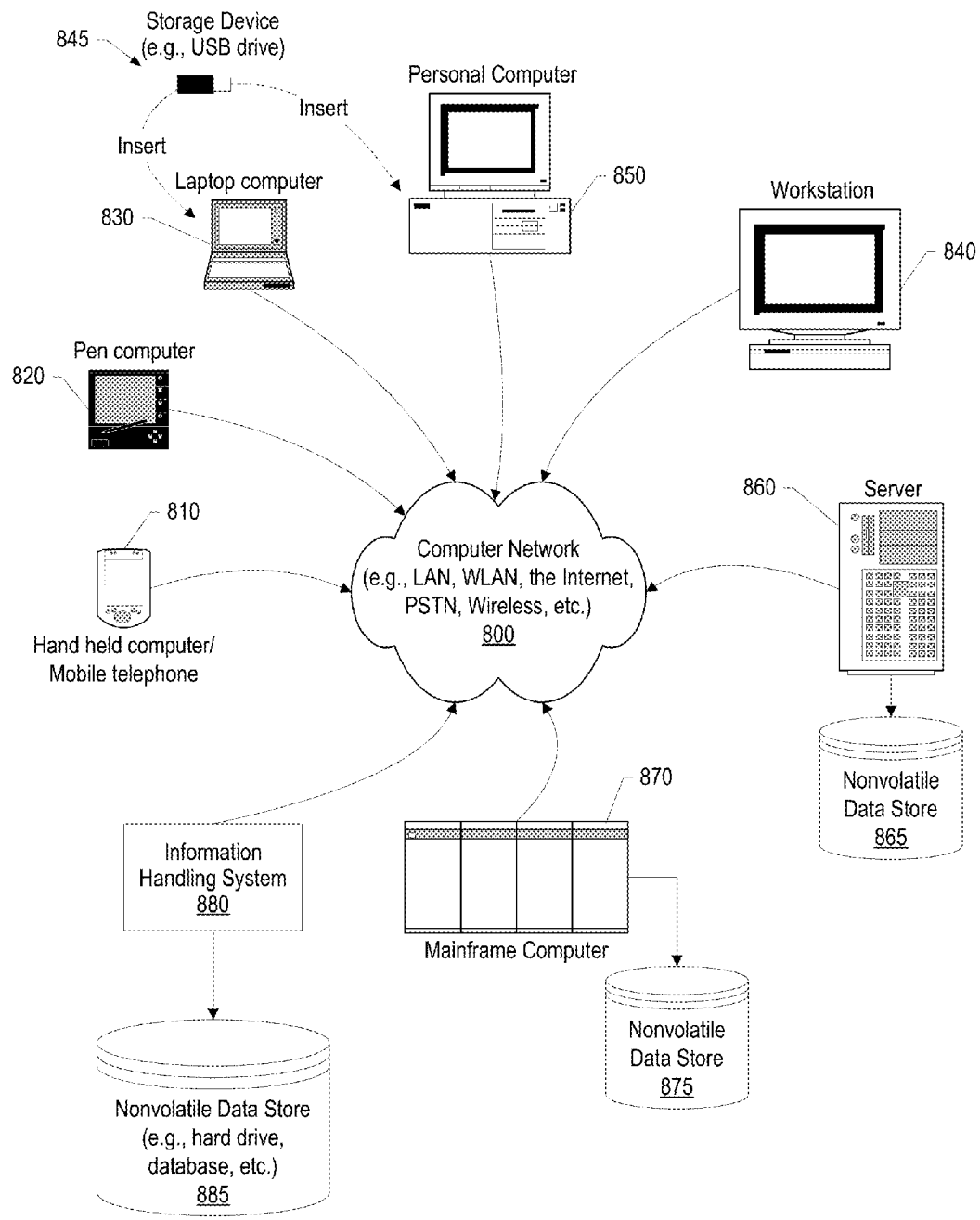
FIG. 8 provides an extension of the information handling system environment shown in FIG. 7 to illustrate that the methods described herein can be performed on a wide variety of information handling systems which operate in a networked environment.

FIG. 8 provides an extension of the information handling system environment shown in FIG. 7 to illustrate that the methods described herein can be performed on a wide variety of information handling systems that operate in a networked environment. Types of information handling systems range from small handheld devices, such as handheld computer/mobile telephone 810 to large mainframe systems, such as mainframe computer 870. Examples of handheld computer 810 include personal digital assistants (PDAs), personal entertainment devices, such as MP3 players, portable televisions, and compact disc players. Other examples of information handling systems include pen, or tablet, computer 820, laptop, or notebook, computer 830, workstation 840, personal computer system 850, and server 860. Other types of information handling systems that are not individually shown in FIG. 8 are represented by information handling system 880.

As shown, the various information handling systems can be networked together using computer network 800. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 8 depicts separate nonvolatile data stores (server 860 utilizes nonvolatile data store 865, mainframe computer 870 utilizes nonvolatile data store 875, and information handling system 880 utilizes nonvolatile data store 885). The nonvolatile data store can be a component that is external to the various information handling systems or can be internal to one of the information handling systems. In addition, removable nonvolatile storage device 745 can be shared among two or more information handling systems using various techniques, such as connecting the removable nonvolatile storage device 745 to a USB port or other connector of the information handling systems.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method comprising:
   selecting, by a first interface node included in a plurality of interface nodes, a first logical block address that corresponds to a first contiguous memory location located on a storage device, wherein the storage device is accessible by each of the plurality of interface nodes;
   retrieving, by the first interface node, a first logical block address status indicator from a shared memory area that indicates the status of the first logical block address, the shared memory area accessible by each of the plurality of interface nodes;
   determining, based upon the first logical block address indicator, whether the first logical block address is utilized by a second interface node included in the plurality of nodes; and
   testing, by the first interface node, the corresponding first contiguous memory location in response to determining that the logical block address fails to be utilized by the second interface node.

2. The method of claim 1 wherein:
the storage device is included in a plurality of storage devices that comprise a direct access storage domain utilized by a supercomputer complex; and
the supercomputer complex includes a plurality of compute nodes that communicate with the direct access storage domain through the plurality of interface nodes.

3. The method of claim 1 wherein each of the plurality of interface nodes include a low-level disk exerciser that communicates with the shared memory area utilizing one or more application programming interface (API) messages.

4. The method of claim 1 wherein the storage area includes a plurality of contiguous memory locations that each correspond to one of a plurality of logical block addresses, and wherein each of the plurality of interface nodes utilize the shared memory area to avoid one or more write conflicts to each of the plurality of contiguous memory locations.

5. The method of claim 1 further comprising:
seeding a random number generator with a first seed value;
receiving a first random number from the random number generator based upon the first seed value; and
generating the first logical block address based upon the first random number.

6. The method of claim 5 further comprising:
incrementing a conflict counter in response to determining that the second interface node is utilizing the logical block address;
determining whether the conflict counter reaches a threshold;
in response to determining that the conflict counter fails to reach the threshold:
receiving a second random number from the random number generator based upon the first seed value;
generating a second logical block address based upon the second random number, wherein the second logical block address corresponds to a second contiguous memory area; and
receiving, by the first interface node, a second logical block address status indicator from the shared memory area that indicates the status of the second logical block address.

7. The method of claim 6 further comprising:
in response to determining that the conflict counter reached the threshold:
re-seeding the random number generator with a second seed value;
receiving a different second random number from the random number generator based upon the second seed value;
generating a different second logical block address based upon the different second number generator, wherein the different second logical block address corresponds to a different second contiguous memory area; and
receiving, by the first interface node, a different second logical block address status indicator from the shared memory area that indicates the status of the different second logical block address.

8. An information handling system comprising:
one or more processors;
a memory coupled to at least one of the processors;
a shared memory area accessible by at least one of the processors;
a set of computer program instructions stored in the memory and executed by at least one of the processors in order to perform actions of:
selecting, by a first interface node executing on one of the processors and included in a plurality of interface nodes, a first logical block address that corresponds to a first contiguous memory location located on an external storage device, wherein the external storage device is accessible by each of the plurality of interface nodes;
receiving, by the first interface node, a first logical block address status indicator from the shared memory area that indicates the status of the first logical block address, the shared memory area accessible by each of the plurality of interface nodes;
determining, based upon the first logical block address indicator, whether the first logical block address is utilized by a second interface node included in the plurality of nodes; and
testing, by the first interface node, the corresponding first contiguous memory location located on the external storage device in response to determining that the logical block address fails to be utilized by the second interface node.

9. The information handling system of claim 8 wherein the set of computer program instructions, when executed by at least one of the processors, further performs actions of:
the external storage device is included in a plurality of external storage devices that comprise a direct access storage domain utilized by a supercomputer complex; and
the supercomputer complex includes a plurality of compute nodes that communicate with the direct access storage domain through the plurality of interface nodes.

10. The information handling system of claim 8 wherein each of the plurality of interface nodes include a low-level disk exerciser that communicates with the shared memory area utilizing one or more application programming interface (API) messages.

11. The information handling system of claim 8 wherein the external storage area includes a plurality of contiguous memory locations that each correspond to one of a plurality of logical block addresses, and wherein each of the plurality of interface nodes utilize the shared memory area to avoid one or more write conflicts to each of the plurality of contiguous memory locations.

12. The information handling system of claim 8 wherein the set of computer program instructions, when executed by at least one of the processors, further performs actions of:
seeding a random number generator with a first seed value;
receiving a first random number from the random number generator based upon the first seed value; and
generating the first logical block address based upon the first random number.

13. The information handling system of claim 12 wherein the set of computer program instructions, when executed by at least one of the processors, further performs actions of:
incrementing a conflict counter in response to determining that the second interface node is utilizing the logical block address;
determining whether the conflict counter reaches a threshold;
in response to determining that the conflict counter fails to reach the threshold:
receiving a second random number from the random number generator based upon the first seed value;
generating a second logical block address based upon the second random number, wherein the second logical block address corresponds to a second contiguous memory area; and receiving, by the first interface node, a second logical block address status indicator from the shared memory area that indicates the status of the second logical block address.

14. The information handling system of claim 13 wherein the set of computer program instructions, when executed by at least one of the processors, further performs actions of:
in response to determining that the conflict counter reached the threshold:
re-seeding the random number generator with a second seed value;
receiving a different second random number from the random number generator based upon the second seed value;
generating a different second logical block address based upon the different second number generator, wherein the different second logical block address corresponds to a different second contiguous memory area; and
receiving, by the first interface node, a different second logical block address status indicator from the shared memory area that indicates the status of the different second logical block address.

15. A computer program product stored in a non-transitory computer readable storage medium, comprising computer program code that, when executed by an information handling system, causes the information handling system to perform actions comprising:
selecting, by a first interface node included in a plurality of interface nodes, a first logical block address that corresponds to a first contiguous memory location located on a storage device, wherein the storage device is accessible by each of the plurality of interface nodes;
receiving, by the first interface node, a first logical block address status indicator from a shared memory area that indicates the status of the first logical block address, the shared memory area accessible by each of the plurality of interface nodes;
determining, based upon the first logical block address indicator, whether the first logical block address is utilized by a second interface node included in the plurality of nodes; and
testing, by the first interface node, the corresponding first contiguous memory location in response to determining that the logical block address fails to be utilized by the second interface node.

16. The computer program product of claim 15 wherein:
the storage device is included in a plurality of storage devices that comprise a direct access storage domain utilized by a supercomputer complex; and
the supercomputer complex includes a plurality of compute nodes that communicate with the direct access storage domain through the plurality of interface nodes.

17. The computer program product of claim 15 wherein each of the plurality of interface nodes include a low-level disk exerciser that communicates with the shared memory area utilizing one or more application programming interface (API) messages.

18. The computer program product of claim 15 wherein the storage area includes a plurality of contiguous memory locations that each correspond to one of a plurality of logical block addresses, and wherein each of the plurality of interface nodes utilize the shared memory area to avoid one or more write conflicts to each of the plurality of contiguous memory locations.

19. The computer program product of claim 15 wherein the information handling system performs further actions comprising:
seeding a random number generator with a first seed value;
receiving a first random number from the random number generator based upon the first seed value; and
generating the first logical block address based upon the first random number.

20. The computer program product of claim 19 wherein the information handling system performs further actions comprising:
incrementing a conflict counter in response to determining that the second interface node is utilizing the logical block address;
determining whether the conflict counter reaches a threshold;
in response to determining that the conflict counter fails to reach the threshold:
receiving a second random number from the random number generator based upon the first seed value;
generating a second logical block address based upon the second random number, wherein the second logical block address corresponds to a second contiguous memory area; and
receiving, by the first interface node, a second logical block address status indicator from the shared memory area that indicates the status of the second logical block address.

21. The computer program product of claim 20 wherein the information handling system performs further actions comprising:
in response to determining that the conflict counter reached the threshold:
re-seeding the random number generator with a second seed value;
receiving a different second random number from the random number generator based upon the second seed value;
generating a different second logical block address based upon the different second number generator, wherein the different second logical block address corresponds to a different second contiguous memory area; and
receiving, by the first interface node, a different second logical block address status indicator from the shared memory area that indicates the status of the different second logical block address.

22. A method comprising:
seeding, by a first a first interface node included in a plurality of interface nodes, a random number generator with a seed value;
receiving, at the first interface node, a first random number from the random number generator based upon the seed value;
generating, by the first interface node, a first logical block address based upon the first random number, wherein the first logical block address corresponds to a first contiguous memory location located on a storage device, and wherein the storage device is accessible by each of the plurality of interface nodes;
receiving, by the first interface node, a first logical block address status indicator from a shared memory area that indicates the status of the first logical block address, the shared memory area accessible by each of the plurality of interface nodes;

determining, based upon the first logical block address indicator, whether the first logical block address is utilized by a second interface node included in the plurality of nodes; and testing, by the first interface node, the corresponding first contiguous memory location in response to determining that the logical block address fails to be utilized by the second interface node.

23. The method of claim 22 wherein:

the storage device is included in a plurality of storage devices that comprise a direct access storage domain utilized by a supercomputer complex; and the supercomputer complex includes a plurality of compute nodes that communicate with the direct access storage domain through the plurality of interface nodes.

24. The method of claim 22 wherein each of the plurality of interface nodes include a low-level disk exerciser that communicates with the shared memory area utilizing one or more application programming interface (API) messages.

25. The method of claim 22 wherein the storage area includes a plurality of contiguous memory locations that each correspond to one of a plurality of logical block addresses, and wherein each of the plurality of interface nodes utilize the shared memory area to avoid one or more write conflicts to each of the plurality of contiguous memory locations.

* * * * *